(12) United States Patent
Chen et al.

(10) Patent No.: US 10,032,631 B1
(45) Date of Patent: Jul. 24, 2018

(54) METHOD OF FABRICATING MASK PATTERN

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Li-Chiang Chen, Tainan (TW); Fu-Che Lee, Taichung (TW); Ming-Feng Kuo, Tainan (TW); Hsien-Shih Chu, Kaohsiung (TW); Cheng-Yu Wang, Kaohsiung (TW); Yu-Chen Chuang, Kaohsiung (TW)

(73) Assignees: UNITED MICROELECTRONICS CORP., Hsin-Chu (TW); Fujian Jinhua Integrated Circuit Co., Ltd., Quanzhou, Fujian province (CN)

(*) Notice: Subject to any disclaimer, the term of this patent is extended or adjusted under 35 U.S.C. 154(b) by 0 days.

(21) Appl. No.: 15/591,132

(22) Filed: May 10, 2017

(30) Foreign Application Priority Data

Apr. 17, 2017 (CN) .......................... 2017 1 0248133

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *B23P 15/00* | (2006.01) |
| *C03C 25/00* | (2018.01) |
| *H01L 21/033* | (2006.01) |

(52) U.S. Cl.
CPC ...... *H01L 21/0335* (2013.01); *H01L 21/0332* (2013.01); *H01L 21/0337* (2013.01)

(58) Field of Classification Search
CPC .......... H01L 21/3086; H01L 21/31051; H01L 21/027; H01L 21/302; H01L 21/3043
See application file for complete search history.

(56) References Cited

U.S. PATENT DOCUMENTS

| | | | | |
|---|---|---|---|---|
| 9,318,330 | B2 | 4/2016 | Tagami | |
| 9,818,611 | B2* | 11/2017 | deVilliers | ........... H01L 21/0337 |
| 2006/0240361 | A1* | 10/2006 | Lee | ...................... H01L 21/0337 430/313 |
| 2007/0099431 | A1* | 5/2007 | Li | ........................ H01L 21/3081 438/735 |
| 2008/0008969 | A1* | 1/2008 | Zhou | .................... H01L 21/0337 430/313 |
| 2008/0261389 | A1 | 10/2008 | Jung | |
| 2015/0087149 | A1* | 3/2015 | He | ...................... H01L 21/0338 438/696 |
| 2016/0351411 | A1* | 12/2016 | Xie | ..................... H01L 21/3086 |

* cited by examiner

*Primary Examiner* — Thomas Pham
(74) *Attorney, Agent, or Firm* — Winston Hsu

(57) ABSTRACT

A method of fabricating a mask pattern includes providing numerous masks on a substrate. A wider trench and a narrower trench are respectively defined between the mask. Subsequently, a mask material is formed to fill in the wider trench and the narrower trench. The top surface of the mask material overlapping the wider trench is lower than the top surface of the mask material overlapping the narrower trench. A photoresist layer is formed on the mask material overlapping the wider trench. Later, the mask material overlapping the narrower trench is etched while the mask material overlapping the wider trench is protected by the photoresist layer.

9 Claims, 4 Drawing Sheets

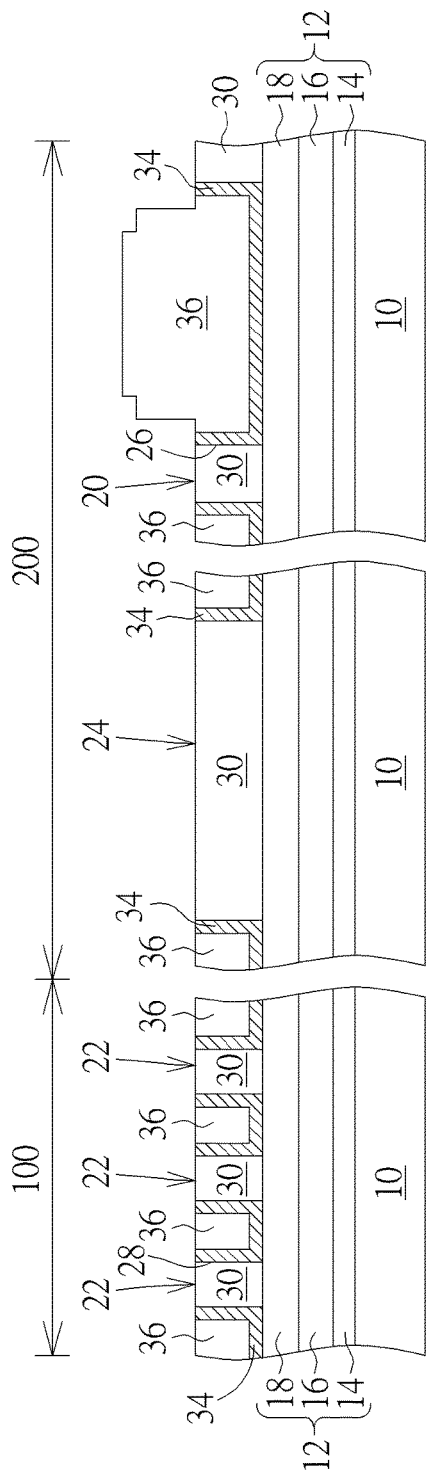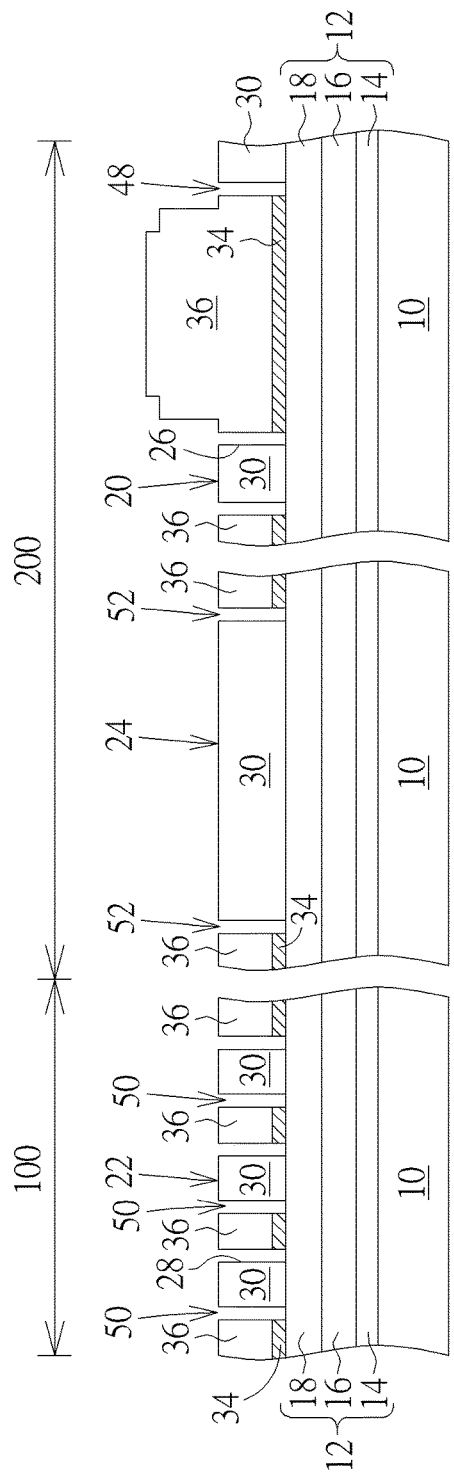

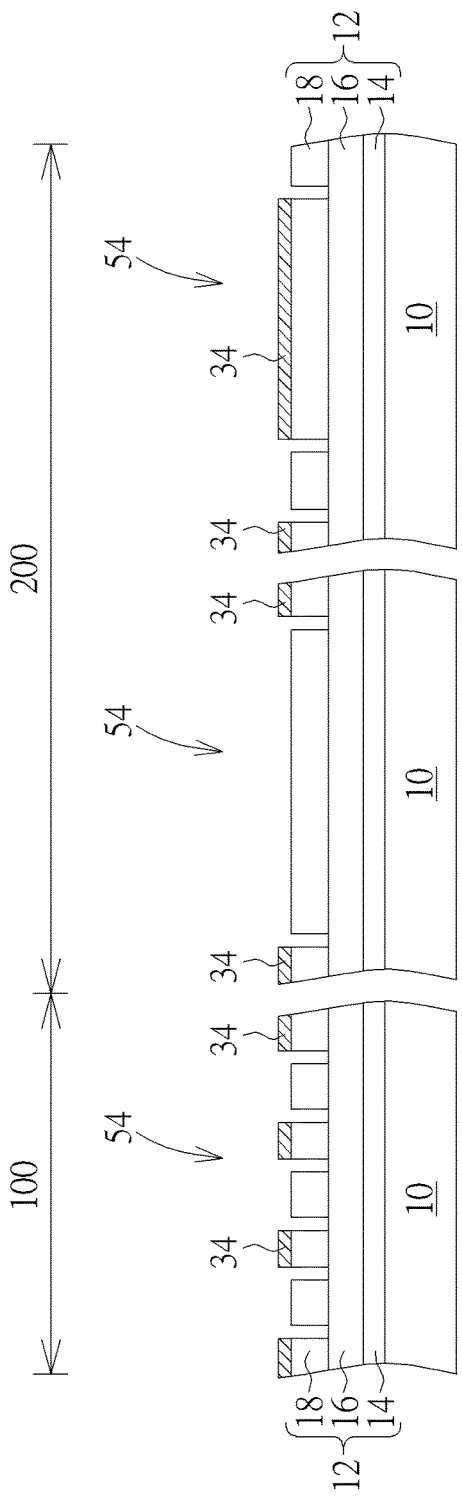
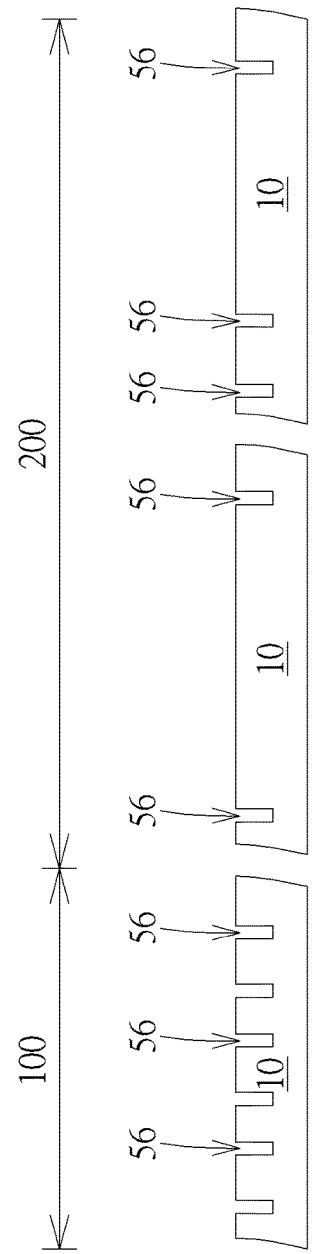

METHOD OF FABRICATING MASK PATTERN

BACKGROUND OF THE INVENTION

1. Field of the Invention

The present invention relates to a method of fabricating a mask pattern, and more particularly, to a method of preventing over-etching at a wider trench while forming a mask pattern.

2. Description of the Prior Art

As device dimensions continue to shrink and the level of integration continues to increase, a structure for isolating devices must reduce in size accordingly. A shallow trench isolation (STI) structure is scalable without resulting in any bird's beak encroachment problem, as presented in the conventional local oxidation of silicon (LOCOS) process, and is therefore the preferred isolation technique for current semiconductor fabrication processes.

Integrated circuits (IC) are generally fabricated on a substrate. The process of lithography, in conjunction with the process of etching, is used to pattern features in thin film stacks that have been formed on the substrate. At each layer of the fabrication, the wafer is first coated with photoresist. The photoresist is then developed to produce an image corresponding to the pattern on a reticle. Next, an etch process transfers the pattern into the thin film stacks on the wafer. Finally, the photoresist is removed.

Before exposing the photoresist, it may be desirable or necessary to correctly align the reticle to ensure that the functional features are imaged in a correct position on the substrate. Conventionally, this is achieved by using alignment marks.

During the formation of trenches for the STI structure and alignment marks, several masks besides the photoresist are used to transfer trench patterns to the substrate. While transferring these trench patterns, however, over-etching on the masks may occur.

SUMMARY OF THE INVENTION

Accordingly, the present invention provides a method to solve the over-etching problem.

According to a preferred embodiment of the present invention, a method of fabricating a mask pattern includes providing a substrate. A first material layer covers the substrate. At least two first masks and two second masks cover the first material layer. A first trench is defined between the first masks. A second trench is defined between the second masks. A width of the first trench is greater than a width of the second trench. A second material layer conformally covers the first trench and the second trench. A first mask material fills in the first trench and protrudes from the first trench. The first mask material fills in the second trench and protrudes from the second trench. A second mask material covers the first mask material. Next, a third mask material is formed to cover the second mask material overlapping the first trench and expose the second mask material overlapping the second trench. Subsequently, the second mask material overlapping the second trench is removed by taking the third mask material as a first protective mask. Later, after removing the third mask material overlapping the second trench, the first mask material overlapping the second and first trenches is thinned to expose the second material layer on sidewalls of the second and first trenches by taking the second mask material as a second protective mask. The second mask material is then removed entirely. The second material layer contacting the sidewalls of the first trench is removed to form two third trenches, and the second material layer contacting the sidewalls of the second trench is removed to form two fourth trenches. Finally, after forming the third trenches and the fourth trenches, part of the first material layer is removed to form a mask pattern by taking the first mask material, the first masks and the second masks as a third protective mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a method of fabricating a mask pattern according to a preferred embodiment of the present invention, wherein:

FIG. 1 depicts a stage of providing a substrate with a first trench and a second trench thereon;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4; and
FIG. 6 is a fabricating stage following FIG. 5.
FIG. 7 depicts a method of fabricating trenches on a substrate by using a mask pattern.

DETAILED DESCRIPTION

Figure 1:
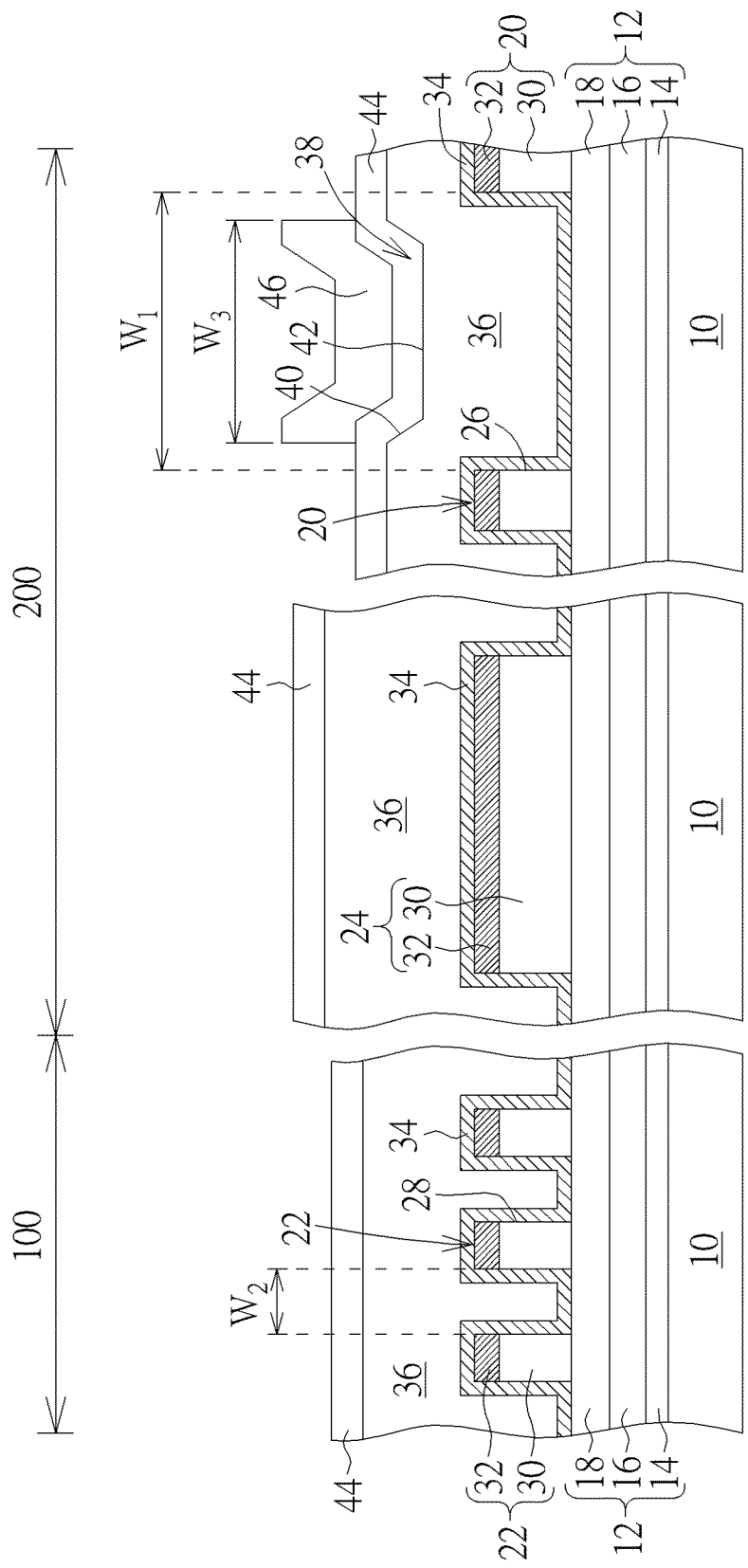

FIG. 1 to FIG. 6 depict a method of fabricating a mask pattern according to a preferred embodiment of the present invention. As shown in FIG. 1, a substrate 10 is provided. The substrate 10 is divided into an active region 100 and a peripheral region 200. The substrate 10 includes a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A first material layer 12 is on the substrate 10. The first material 12 may be a single layer or a stacked layer made by different materials. The first material 12 may include silicon oxide, amorphous silicon, silicon nitride, silicon oxynitride or other materials. According to a preferred embodiment of the present invention, the first material layer 12 is a stacked layer including a silicon oxide layer 14, an amorphous silicon layer 16 and a silicon nitride layer 18 disposed from bottom to top. At least two first masks 20, at least two second masks 22, and at least one third mask 24 covering the first material layer 12. The first masks 20, and the third mask 24 are disposed within the peripheral region 200. The second masks 22 are disposed within the active region 100. The present invention shows two first masks 20, and two second masks 22 and one third mask 24 as an example. The number of first masks 20, second mask 22 and third mask 24 can be adjusted based on product requirements, however. A first trench 26 is defined between the adjacent first masks 20. A second trench 28 is defined between the adjacent second masks 22. It is worthy of note that a width $W_1$ of the first trench 26 is greater than a width $W_2$ of the second trench 28. According to a preferred embodiment of the present invention, the width $W_1$ of the first trench 26 is greater than 250 nanometers. The width $W_2$ of the second trench 28 is between 45 and 55 nanometers. Furthermore, each of the first masks 20 may include stacked materials such as an organic dielectric layer 30 and a silicon-containing hard mask bottom anti-reflection coating (SHB) 32. The organic dielectric layer 30 is under the SHB 32. Similarly, the second masks 22 and the third mask 24 also individually include the organic dielectric layer 30 and the SHB 32. In the second masks 22 and the third mask 24, the organic dielectric layer 30 is also under the SHB 32.

Next, a second material layer 34 is formed to conformally cover the first masks 20, the second masks 22 and the third mask 24. The second material layer 34 also conformally covers the first trench 26 and the second trench 28. The second material layer 34 is preferably silicon oxide. Later, a first mask material 36 is formed to cover the second material layer 34. In detail, the first mask material layer 36 fills in the first trench 26 and the second trench 28. The first mask material layer 36 protrudes from the first trench 26 and the second trench 28. In addition, the first mask material 36 covers the third mask 24. The first mask material 36 is preferably formed by a spin coating process. Generally speaking, the first mask material 36 formed by the spin coating process should have a planar top surface; however, because the width $W_1$ of the first trench 26 is greater than the width $W_2$ of the second trench 28, the top surface of the first mask material layer 36 overlapping the first trench 26 is lower than the top surface of the first material layer 36 overlapping the second trench 28. The top surface of the first mask material layer 36 overlapping the third mask 24 is higher than the top surface of the first mask material layer 36 overlapping the first trench 26. The first mask material 36 is preferably an organic dielectric layer. Furthermore, the profile of the first mask material 36 overlapping the first trench 26 is influenced by the profile of the first trench 26 underneath. Therefore, a recess 38 will be formed by the top surface of the first mask material 36. The recess 38 includes two sidewalls 40 and a bottom 42.

A second mask material 44 is formed to cover the first mask material 36. The top surface of the first mask material 36 overlapping the first trench 26, on the second trench 28 and on the third mask 24 has a different height with respective to the substrate 10. Therefore, the top surface of the second mask material 44 overlapping the first trench 26, on the second trench 28 and on the third mask 24 also has a different height with respect to the substrate 10. In detail, the top surface of the second mask material 44 overlapping the first trench 26 is lower than the top surface of the second material layer 44 overlapping the second trench 28. The top surface of the second mask material 44 overlapping the third mask 24 is higher than the top surface of the second mask material 44 overlapping the first trench 26. The second mask material 44 is preferably a silicon-containing hard mask bottom anti-reflection coating.

A third mask material 46 is formed to cover the second mask material 44 overlapping the first trench 26, and expose the second mask material 44 overlapping the second trench 28. In addition, the second mask material 44 overlapping the third mask 24 is also exposed. Only the second mask material 44 overlapping the first trench 26 is covered by the third mask material 46. The third mask material 46 overlaps the bottom 42 and the two sidewalls 40 of the recess 38. The third mask material 46 can either only partly overlap each sidewall 40 or entirely overlap each of the sidewalls 40. The third mask material 46 should not overlap the second material layer 34 on the sidewalls of the first trench 26. In other words, a width $W_3$ of the third mask material 46 should be smaller than the width $W_1$ of the first trench 26. The third mask material 46 is preferably photoresist.

Figure 2:
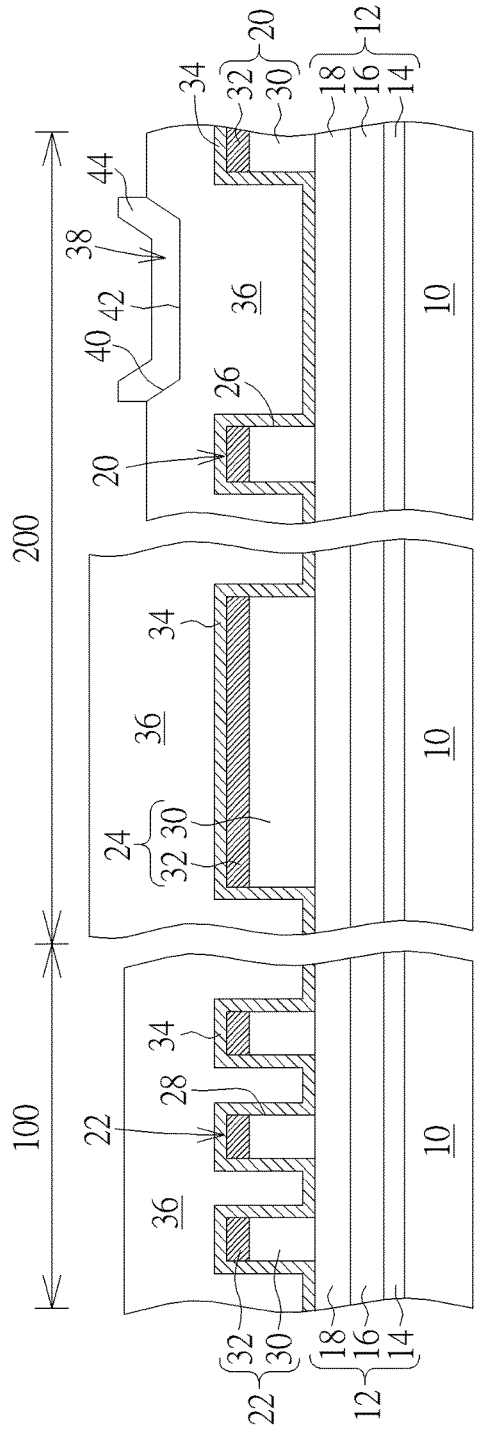

As shown in FIG. 2, part of the second mask material 44 is removed by taking the third mask material 46 as a mask. More specifically, the second mask material 44 overlapping the second trench 28, overlapping the second masks 22, overlapping the first masks 20, and overlapping the third mask 24 is removed. The removal of the second mask material 44 can be performed by a dry etching process. While removing the second mask material 44, the third mask material 46 is usually entirely consumed. If any third mask material 46 remains, this third mask material 46 will be entirely removed after the second mask material 44 is removed.

Figure 3:
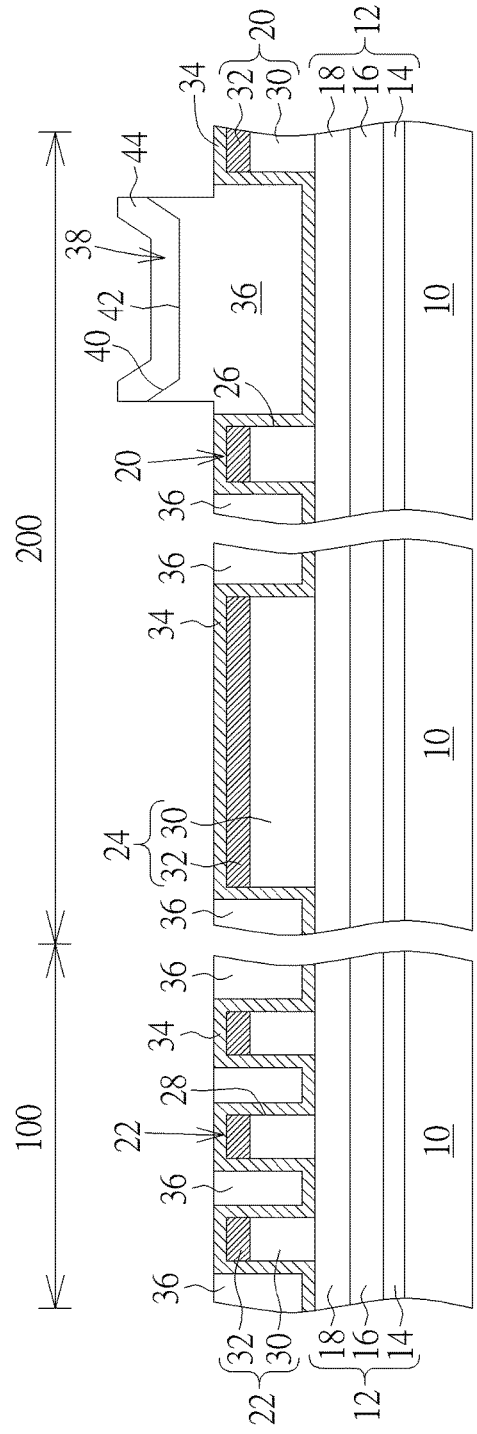

As shown in FIG. 3, the first mask material 36 overlapping the second trench 28, and overlapping the first trench 26 are thinned by taking the second mask material 44 as a mask and taking the second material layer 34 as a stop layer. The thinning process continues until the second material layer 34 on the second masks 22, on the sidewalls of the second trench 28, on the third mask 24, on the first masks 20 and on the sidewalls of the first trench 26 is exposed. The first mask material 36 not covered by the second mask material 44 is thinned. The second mask material 44 can be thinned by an etching process. At this point, the top surface of the first mask material 36 in the second trench 28 is aligned with the top surface of the second material layer 34 on the sidewalls of the second trench 28. The top surface of the first mask material 36 overlapping the first trench 26 is higher than the top surface of the second material layer 34 on the sidewalls of the first trench 26.

As shown in FIG. 4, the second mask material 44 is removed entirely. Then, the first mask material 36, the second material layer 34, the SHB 32 of the first masks 20, the SHB 32 of the second masks 22 and the SHB 32 of the third mask 24 are subjected to a removal process until the organic dielectric layer 30 of the first masks 20, the organic dielectric layer 30 of the second masks 22 and the organic dielectric layer 30 of the third mask 24 are exposed. At this point, the second material layer 34, the first mask material 36 in the first trench 26, the organic dielectric layer 30 of the first masks 20, the organic dielectric layer 30 of the second masks 22 and the organic dielectric layer 30 of the third mask 24 remain. The top surface of the first mask material 36 overlapping the first trench 26 is higher than the top surface of the second material layer 34 on the sidewalls of the first trench 26. The top surface of the second material layer 34, the top surface of the organic dielectric layer 30 of the first masks 20, the top surface of the organic dielectric layer 30 of the second masks 20, and the top surface of the organic dielectric layer 30 of the third mask 24 are aligned with the top surface of the first mask material 36 outside of the first trench 26. The removal process is preferably a dry etching process performed in an etching back manner.

As shown in FIG. 5, the second material layer 34 contacting the sidewalls of the first trench 26 is removed to form two third trenches 48. The second material layer 34 contacting the sidewalls of the second trench 28 is removed to form two fourth trenches 50. The second material layer 34 contacting the sidewalls of the remaining third mask 24 is removed to form two fifth trenches 52. As shown in FIG. 6, part of the first material layer 12 is removed to forma mask pattern 54 by taking the first mask material 36, the remaining first mask 20, the remaining second masks 22, and the remaining third mask 24 as a mask. The removal of the first material layer 12 is preferably an etching process. The first mask material 36, the remaining first masks 20, the remaining second masks 22, and the remaining third mask 24 are all made of an organic dielectric layer. Therefore, first mask material 36, the remaining first masks 20, the remaining second masks 22, and the remaining third mask 24 have the same etching selectivity comparing to the first material layer 12. When removing the first material layer 12, the first mask material 36, the remaining first masks 20, the remaining second masks 22 and the remaining third mask 24 are consumed. In this embodiment, the first mask material 36, the remaining first masks 20, the remaining second masks 22 and the remaining third mask 24 are all worn out. If some of the first mask material 36, the remaining first masks 20, the remaining second masks 22 and the remaining third mask 24 are still left behind, a process to entirely remove the first mask material 36, the remaining first masks 20, the remaining second masks 22 and the remaining third mask 24 will be performed. As shown in FIG. 7, part of the substrate 10 is removed to form numerous trenches 56 by taking the mask pattern 54 as a mask. Later, the mask pattern 54 is removed. The trenches 56 within the active region 100 may become part of a shallow trench isolation. The trenches 56 within the peripheral region 200 may serve as an alignment mark afterwards. The trenches 56 can have different functions besides being used as the shallow trench isolation and the alignment mark.

When the first mask material fills in a wider trench and a narrower trench, the top surface of the first mask material overlapping the wider trench is lower than the top surface of the first mask material overlapping the narrower trench, even when a spin coating process is applied to spread the first mask material. Therefore, a third mask material such as a photoresist is specially formed on the wider trench to protect the lower part of the first mask material while the higher part of the first mask material is etched. In this way, the lower part of the first mask material can be prevented from being used up before the end of the etching process, and the material layers under the lower part of the first mask material are protected from damage. Furthermore, although the wider trench (first trench) is disposed in the peripheral region in the above embodiment, the wider trench can also be disposed in the active region near the peripheral region. In another case, the wider trench or the narrower trench can both be within the active region or both be within the peripheral region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a mask pattern comprising:
providing a substrate, a first material layer covering the substrate, at least two first masks and at least two second masks covering the first material layer, a first trench defined between the at least two first masks, a second trench defined between the at least two second masks, a width of the first trench being greater than a width of the second trench, a second material layer conformally covering the first trench and the second trench, a first mask material filling in the first trench and protruding from the first trench, the first mask material filling in the second trench and protruding from the second trench and a second mask material covering the first mask material;
forming a third mask material covering the second mask material overlapping the first trench, and exposing the second mask material overlapping the second trench;
removing the second mask material overlapping the second trench by using the third mask material as a first protective mask;
after removing the second mask material overlapping the second trench, thinning the first mask material overlapping the second trench and first trench to expose the second material layer on a sidewall of the second trench, and on a sidewall of the first trench by using the second mask material as a second protective mask;
removing the second mask material entirely;
removing the second material layer contacting the sidewalls of the first trench to form two third trenches, and removing the second material layer contacting the sidewalls of the second trench to form two fourth trenches; and
after forming the two third trenches and the two fourth trenches, removing part of the first material layer to form the mask pattern by using the first mask material, the at least two first masks and the at least two second masks as a third protective mask.

2. The method of fabricating a mask pattern of claim 1, further comprising:
removing part of the substrate to form a plurality of trenches by using the mask pattern as a fourth protective mask.

3. The method of fabricating a mask pattern of claim 1, wherein before forming the third mask material, a top surface of the first mask material overlapping the first trench is lower than a top surface of the first mask material overlapping the second trench.

4. The method of fabricating a mask pattern of claim 3, wherein a recess is formed by the first mask material overlapping the first trench, and the third mask material overlaps sidewalls and a bottom of the recess.

5. The method of fabricating a mask pattern of claim 1, wherein after forming the third mask material, the second mask material overlapping the at least two first masks and the second mask material overlapping the at least two second masks is not covered by the third mask material.

6. The method of fabricating a mask pattern of claim 1, wherein the second material layer conformally covers the at least two first masks and the at least two second masks.

7. The method of fabricating a mask pattern of claim 1, wherein a top surface of each of the at least two first masks aligns with a top surface of each of the at least two second masks.

8. The method of fabricating a mask pattern of claim 1, wherein a width of the first trench is greater than 250 angstroms and a width of the second trench is between 45 and 55 angstroms.

9. The method of fabricating a mask pattern of claim 1, wherein a width of the third mask material is smaller than a width of the first trench, and the third mask material does not overlap the second material layer on the sidewalls of the first trench.

* * * * *